United States Patent
Lee et al.

(10) Patent No.: US 9,505,607 B2
(45) Date of Patent: Nov. 29, 2016

(54) METHODS OF FORMING SENSOR INTEGRATED PACKAGES AND STRUCTURES FORMED THEREBY

(71) Applicant: Intel Corporation, Santa Clara, CA (US)

(72) Inventors: Kyu Oh Lee, Chandler, AZ (US); Zheng Zhou, Chandler, AZ (US); Islam A. Salama, Scottsdale, AZ (US); Feras Eid, Chandler, AZ (US); Sasha N. Oster, Chandler, AZ (US); Lay Wai Kong, Phoenix, AZ (US); Javier Soto Gonzalez, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/671,549

(22) Filed: Mar. 27, 2015

(65) Prior Publication Data

US 2016/0280535 A1    Sep. 29, 2016

(51) Int. Cl.
*B81B 3/00* (2006.01)
*B81C 1/00* (2006.01)

(52) U.S. Cl.
CPC ......... *B81B 3/0091* (2013.01); *B81C 1/00706* (2013.01); *B81B 2201/0235* (2013.01); *B81B 2201/0242* (2013.01); *B81B 2203/0181* (2013.01); *B81C 2203/0145* (2013.01)

(58) Field of Classification Search
CPC .............................. H01L 29/82; H01L 43/065
USPC ............... 257/421, 422, 423; 438/51, 52, 53
See application file for complete search history.

(56) References Cited

U.S. PATENT DOCUMENTS

| | | | |
|---|---|---|---|
| 6,778,046 B2 * | 8/2004 | Stafford | B81B 7/0077 200/181 |
| 2005/0132814 A1 | 6/2005 | Satou et al. | |
| 2009/0127590 A1 | 5/2009 | Shimada | |
| 2010/0039729 A1 * | 2/2010 | Heck | B82Y 10/00 360/110 |
| 2014/0000377 A1 | 1/2014 | Lin et al. | |
| 2014/0165723 A1 | 6/2014 | Ma et al. | |

FOREIGN PATENT DOCUMENTS

KR   10-2008-0101010 A   11/2008

OTHER PUBLICATIONS

Lee et al., U.S. Appl. No. 14/141,875, titled "Integration of Pressure or Inertial Sensors Into Integrated Circuit Fabrication and Packaging", filed on Dec. 27, 2013, 55 pages.

(Continued)

*Primary Examiner* — Quoc Hoang
(74) *Attorney, Agent, or Firm* — Alpine Technology Law Group LLC (57) ABSTRACT

Methods of forming sensor integrated package devices and structures formed thereby are described. An embodiment includes providing a substrate core, wherein a first conductive trace structure and a second conductive trace structure are disposed on the substrate core, forming a cavity between the first conductive trace structure and the second conductive trace structure, and placing a magnet on a resist material disposed on a portion of each of the first and second conductive trace structures, wherein the resist material does not extend over the cavity.

22 Claims, 12 Drawing Sheets

(56) References Cited

OTHER PUBLICATIONS

Eid et al., U.S. Appl. No. 14/141,759, titled "Magnet Placement for Integrated Sensor Packages", filed on Dec. 27, 2013, 30 pages.

International Search Report and Written Opinion received for International Application No. PCT/US2016/019574, mailed on Jun. 7, 2016, 13 pages.

* cited by examiner

METHODS OF FORMING SENSOR INTEGRATED PACKAGES AND STRUCTURES FORMED THEREBY

BACKGROUND OF THE INVENTION

As miniaturization advances, efforts have been made to construct sensors comprising ever decreasing package sizes. In some cases, a sensor or a suite of sensors may be packaged together in a manner similar to an integrated chip package. In other cases, sensors may be integrated as part of a substrate build. For example, micro-electro-mechanical systems (MEMS) devices, such as sensors and actuators, may be found in products ranging from inertial sensors for air-bag triggers in vehicles, to micro-mirrors for displays in the visual arts industry. More recently, sensors devices have been employed in mobile applications such as accelerometers and gyroscopes, for determining the orientation of the mobile devices or in air pressure sensors for altitude sensing, for example. As these technologies mature, the demand for higher precision and greater functionality of such sensor devices has escalated.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

DETAILED DESCRIPTION OF THE PRESENT INVENTION

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views.

Methods and associated structures of forming and utilizing microelectronic structures, such as sensor integrated package devices, are presented. Those methods/structures may include providing a substrate core, wherein a first and a second conductive trace structure are disposed on the core, forming a cavity disposed between the first conductive trace structure and the second conductive trace structure, and placing a magnet on a resist material disposed on a portion of each of the first and second conductive trace structures, wherein the resist is not disposed over the cavity. The magnet may seal the cavity.

Figure 1:
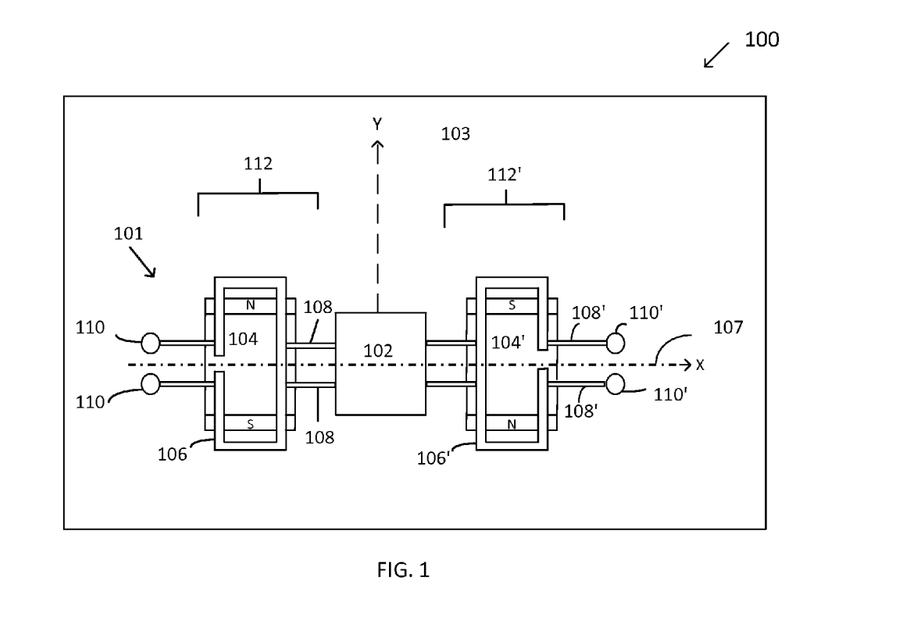
FIG. 1 represents a top plan view of an accelerometer according to embodiments.

FIG. 1 is a top plan view diagram of an accelerometer 101 that may be formed utilizing methods and structures of embodiments herein. In an embodiment, the accelerometer 101 may be disposed within a portion of an integrated sensor package substrate 100. The accelerometer may comprise circuitry features (not shown) that may be communicatively coupled with the package substrate 100. In an embodiment, coreless and/or standard substrate techniques may be utilized to fabricate/integrate the accelerometer 101 with the package substrate 100. In an embodiment, a proof mass 102 may act as an inertial mass of the accelerometer 101, and can be fabricated in a patterned metal layer of the package substrate 100.

In an embodiment, the proof mass 102 may be suspended above and between a pair of magnets 104, 104' that may underlie respective coils 106, 106'. In an embodiment, the proof mass 102 and the coils 106, 106' may be located in a separate plane/layer from the magnets 104, 104' within the package substrate 100. In an embodiment, each coil 106, 106' may accommodate a see-saw movement about an X axis 107. The coils 106, 106' may each be supported by a respective beam 108, 108' located in the same plane/layer of the package substrate as the coils 106, 106'.

The beams 108, 108' may be anchored at each end by respective anchors 110, 110'. The anchors 110, 110' provide mechanical support to the beams 108, 108' and may electrically connect the accelerometer 101 to other circuit elements (not shown) within the sensor integrated package structure 100, in an embodiment. Together, each coil 106, 106' and its respective components (anchors 110,110', beams 108, 108', and magnets 104, 104' may form a detector arm 112, 112' in an embodiment. In an embodiment, one detector arm may be located on either side of the proof mass 102.

When exposed to an acceleration, the proof mass 102 of the accelerometer 101 may move and thereby may induce a mechanical tension in the beams 108, 108', thus changing the resonant frequency of the beams 108, 108'. The change in resonant frequency can be measured by other circuitry (not shown) within, or external to the sensor integrated packaged device/substrate 100 comprising the accelerometer 101, and may be related to the acceleration or changes in acceleration applied to the sensor integrated package substrate 100 comprising the accelerometer 101.

Figure 2:
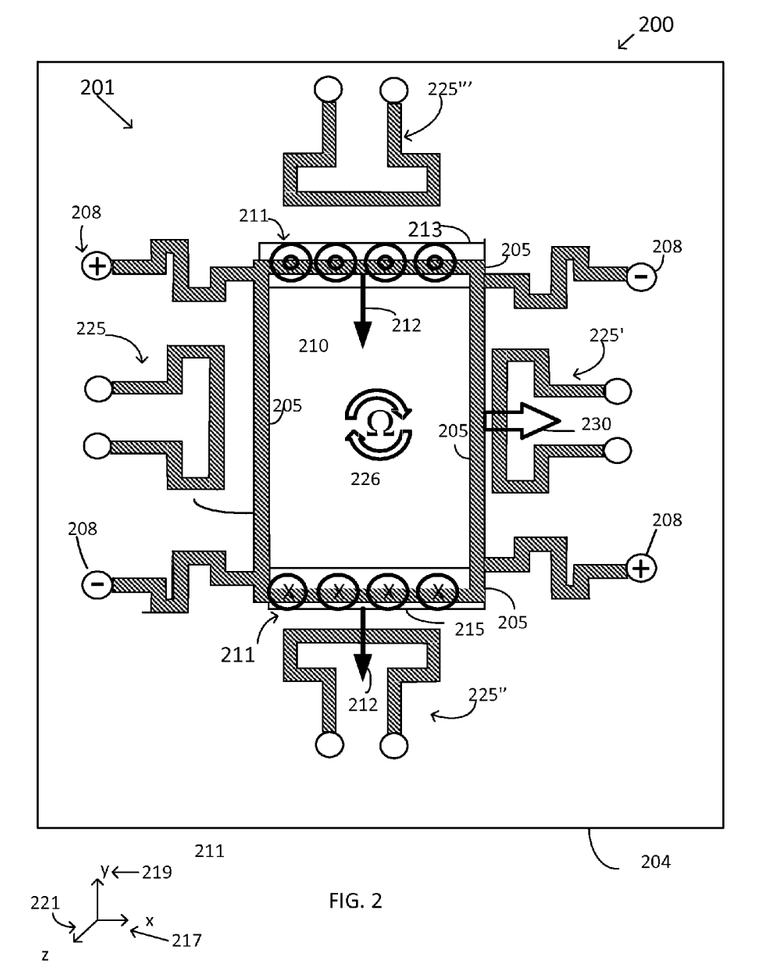
FIG. 2 represents a top plan view of a gyroscope according to embodiments.

FIG. 2 depicts a top plan view of a gyroscope 201 that may be integrated into a portion of the sensor integrated package 200, according to embodiments herein. The gyroscope 201 may be fabricated using standard and/or coreless substrate techniques. In an embodiment, the gyroscope 201 may comprise an inductive gyroscope 201. As shown, a conductive drive coil 205 may be disposed over a substrate 204, and may be anchored to a substrate 204 (which may comprise dielectric material and conductive material within the sensor integrated package 200) by conductive anchors 208, which may comprise copper vias/traces 208 in an embodiment. The drive coil 205 may be parallel to the plane of the substrate 204, and can be formed in a patterned metal layer over a dielectric layer of the package substrate 200, in an embodiment. In an embodiment, the drive coil 205 may comprise orthogonal segments and may comprise one continuous conductive trace loop. In an embodiment, a portion of the dielectric layer surrounding the drive coil may be removed to allow the coil to move in response to angular rotation of the package substrate.

The drive coil 205 may be positioned over a magnet 210, and may be located within its magnetic field 211. In an embodiment, the drive coil 205 may be disposed over a plurality of magnets (not shown). The magnetic field 211 may be perpendicular to the plane of the substrate 204, with the field 211 emanating away from, and returning to the substrate 204 at a north pole 213 and a south pole 215 of the magnet 210, respectively.

In an embodiment, a drive signal generator (not shown) may be coupled with the gyroscope 201, and may provide a time varying current (such as a sinusoidal current, for example) through the drive coil 205. The time varying current may generate an electromagnetic force 212, so that the drive coil 205 may vibrate in one dimension relative to the substrate 204. In an embodiment, when an external angular rotation may occur about an axis of rotation along an orthogonal dimension, a Coriolis force may cause the vibrating drive coil 205 to be displaced along a third dimension 230, orthogonal to a first and second dimension.

In an embodiment, sense coils 225, 225' may register a mutual inductance induced by the displacement of the drive coil 205. Sense coils 225, 225' may be positioned on opposite side of the drive coil 205 and may be parallel to two of the drive coil segments. The sense coils 225 may be fastened to the substrate 204, and may not vibrate in an embodiment. Mutual inductance registered by the sense coils 225 may vary as a function of drive coil 205 displacement in both the x and y dimensions, in an embodiment. The displacement of the drive coil in the dimension resulting from the external rotation with angular velocity Ω 226 may create a time dependent flux across the sense coils 225, 225', which in turn may induce a voltage across each sense coil that may be correlated to the angular velocity Ω 226, in an embodiment. Through signal processing in other circuitry (not shown), a differential signal may be derived from the voltage signals registered by each of the sense coils 225, 225' and may be used to determine the value of the angular velocity Ω 226 of the gyroscope. Additional sense coils 225" and 225'" may be formed parallel to the other two drive coil segments.

Figure 3A:
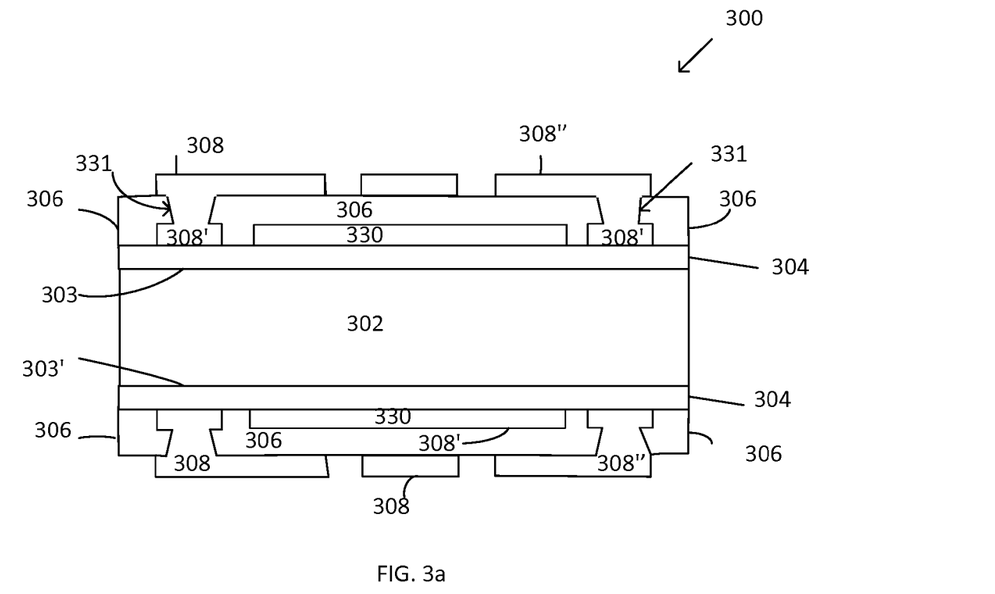
FIGS. 3a-3i represent structures according to embodiments

FIGS. 3a-3i illustrate cross-sectional views of embodiments of forming microelectronic package structures, such as forming sensor integrated package structures, for example. In an embodiment, a portion of a microelectronic package structure 300 may be fabricated to include a sensor, such as a gyroscope and/or an accelerometer. Other types of sensors utilizing the structures herein may be formed according to the particular application, in embodiments. A core material 302, may be utilized to fabricate a sensor (FIG. 3a). In an embodiment, the core material 302 may comprise an organic core material, while in other embodiments, the core material 302 may include any other type of non-organic materials, such as metal or composite laminates.

In an embodiment, the core material 302 may comprise a conductive layer 304 disposed on a first side 303 and on second side 303' of the core 302. The conductive layer 304 may comprise copper layers laminated on each side of the core 302, in an embodiment, and may be peeled off from the built-up layers after package substrate processing is completed to detach the built-up layers from the core. In an embodiment, a dielectric material 306 may comprise such materials as an ABF (Ajinomoto Build-up Film) material, and may be disposed on the conductive layers 304. In an embodiment, the dielectric material 306 may comprise an organic dielectric material 306. In an embodiment, a first and a second metal layer may be disposed within/on the dielectric material 306, using methods such as electroless or electrolytic plating for deposition and lithography for patterning. The first and second metal layers may be electrically connected by conductive metal vias 331 that are plated in the dielectric material 306 after drilling through-holes in the dielectric material 306. There may be additional metal layers disposed within the dielectric material 306, which may comprise patterned conductive layers, in other embodiments.

The package structure 300 may comprise conductive traces 308 that may be disposed within a first metal layer, and conductive traces 308' that may be disposed within a second metal layer, wherein the first metal layer may be disposed over/on the second metal layer. In an embodiment, conductive traces 308, 308' may comprise copper traces 308, 308' for example, or any suitable conductive material. The conductive traces 308, 308' may comprise routing layers and conductive connecting layers, for example, and be used to form conductive structures utilized in the sensor devices included in the embodiments herein, according to the particular design parameters. In an embodiment, the conductive traces 308,308' may comprise components of accelerometer and gyroscope structures, such as those components shown in FIG. 1, and may include such components as beams, coils, and proof masses.

In an embodiment, the conductive traces 308, 308' may be disposed in different conductive layers/levels of the dielectric material 306, and may comprises a first level of conductive traces 308, and a second level of conductive traces 308'. In an embodiment, the first level of conductive traces 308 may comprise a top level of conductive traces 308. In other embodiments, there may be more than two levels of conductive traces, according to the particular design. In an embodiment, vias 331 may be disposed between the first and second metal layers, and may comprise anchor structures. In an embodiment, an etch stop layer 330 may be disposed adjacent to the second metal layer conductive traces 308'.

Figure 3B:
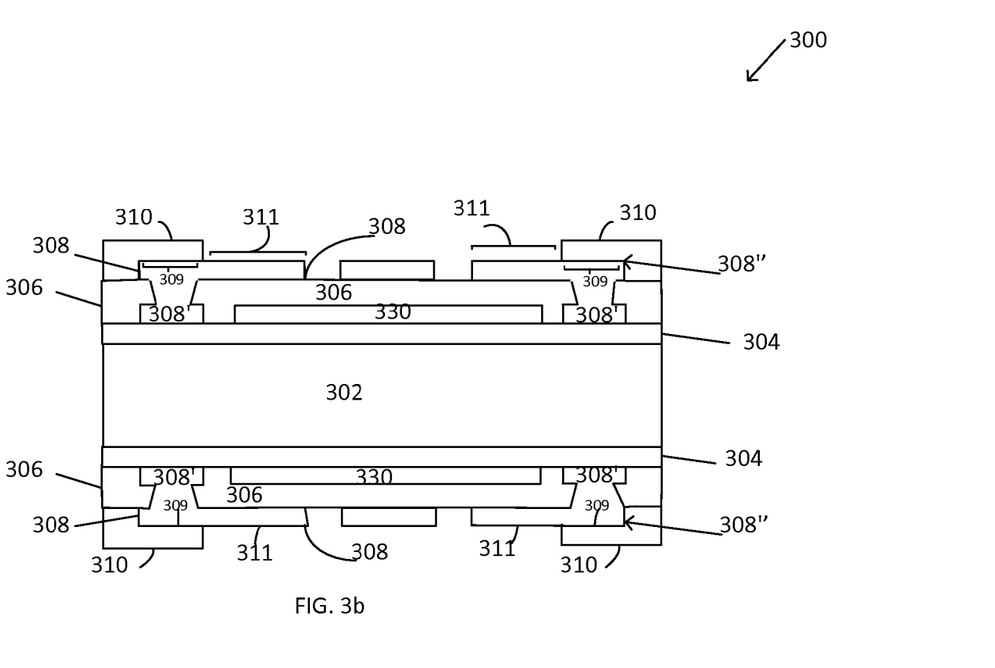
Figure 3C:
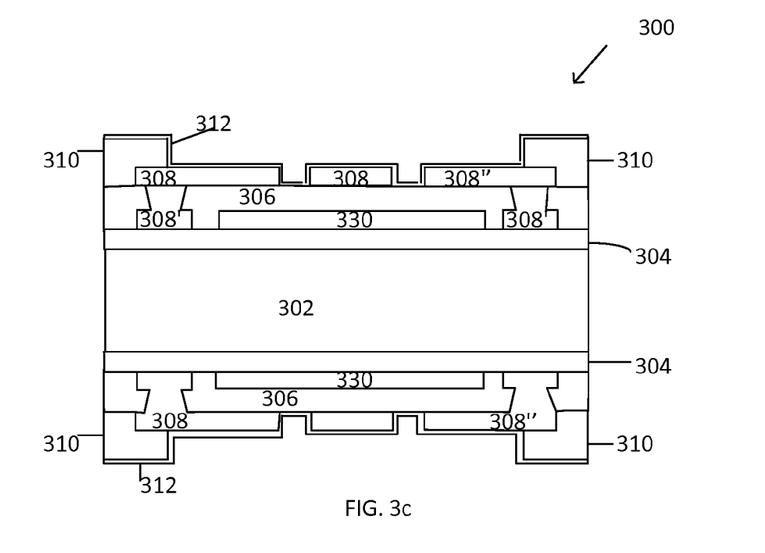

A resist material 310 may be placed and patterned on a first portion 309 of a top surface of each of the adjacent conductive traces 308, 308" while a second portion 311 of each the top surface of the adjacent conductive traces 308, 308" does not comprise the resist material 310, in an embodiment (FIG. 3b). Additionally, a portion of the resist 310 may be placed on the dielectric material 306. In an embodiment, the resist material 310 is not disposed between the second portions 311, 311'. In an embodiment, the first and second conductive traces 308, 308" may be adjacent one another, although additional conductive traces 308 may be disposed between them. In an embodiment, the first and second conductive traces may be disposed in the same metal layer. The resist material 310 may comprise a solder resist material 310 in an embodiment. A masking material 312 may be formed on the resist material 310, on the uncovered portion 311 of the adjacent top conductive traces 308, 308" and on a portion of the dielectric material 306 adjacent the top conductive traces 308, 308" (FIG. 3c). In an embodiment, the masking material 312 may comprise a metal such as copper or an inorganic dielectric material such as silicon nitride for example.

Figure 3D:
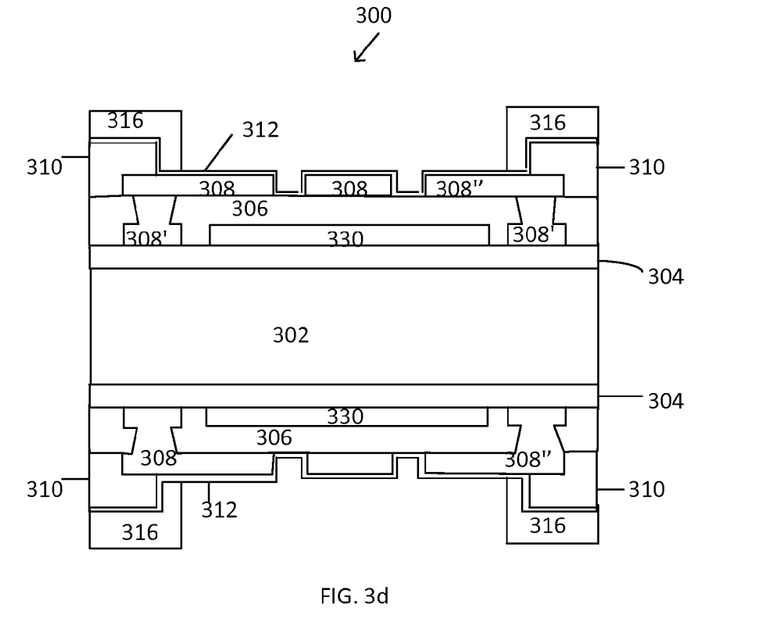
Figure 3E:
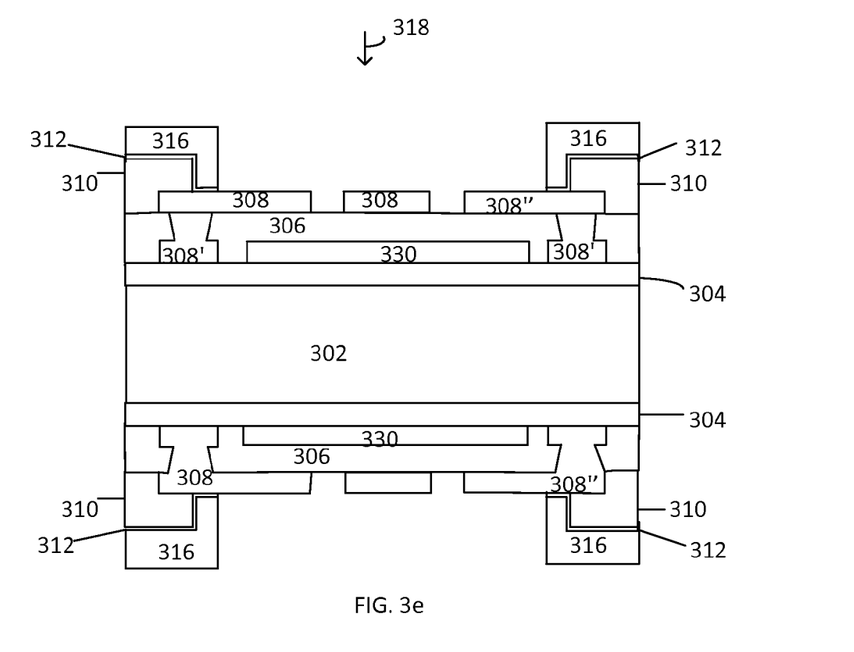
Figure 3F:
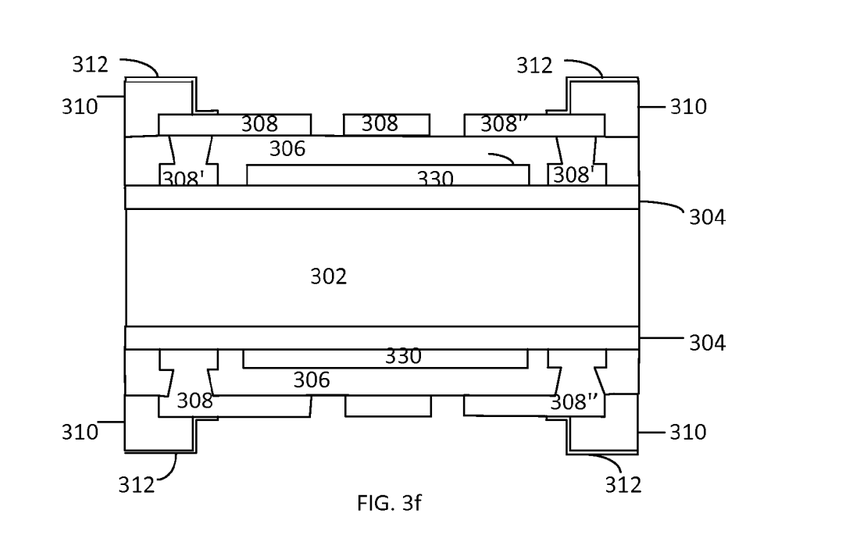

A dry film resist material 316 may be formed on a portion of the first masking material 312, wherein the dry film resist material 316 is disposed over a portion of the first and second conductive traces 308,308" and another portion of the first and second conductive traces 308, 308" is not covered by the dry film resist material 316 (FIG. 3d). The dry film resist material 316 may comprise any suitable resist material. In an embodiment, the masking material 312 may be removed from the top surfaces of the top conductive traces 308, 308" and from the dielectric material 306 between adjacent top conductive traces 308, by utilizing a suitable removal process 318, such as by using an etching process 318 (FIG. 3e). The dry film resist material 316 may then be removed from the first and second top conductive traces 308, 308" wherein a portion of the masking material 312 disposed on the conductive traces 308, 308" and on the first resist material 310 is exposed (FIG. 3f).

Figure 3G:
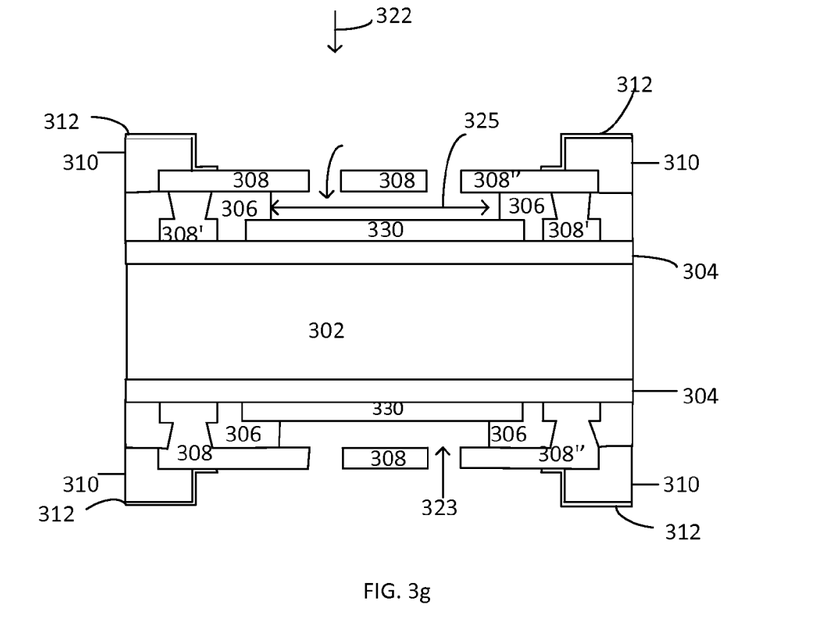
Figure 3H:
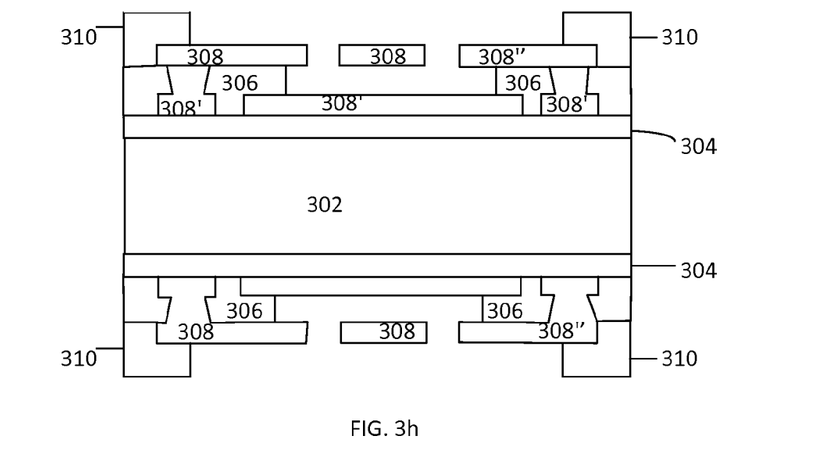

A cavity 323 may be formed in the dielectric material 306 by using a dielectric removal process 322, such as by using a dry etch process for example, wherein a portion of the dielectric 306 is removed between adjacent top conductive traces 308, 308" (FIG. 3g). In an embodiment, the dielectric material 306 is removed beneath the first metal layer, wherein a bottom portion of the cavity 323 comprises the etch stop material 330. In an embodiment, the cavity 323 may comprise a width 325 of between about 100 to about 5000 microns. In other embodiments the width 325 of the cavity 323 will vary depending upon the particular design requirements.

Figure 3I:
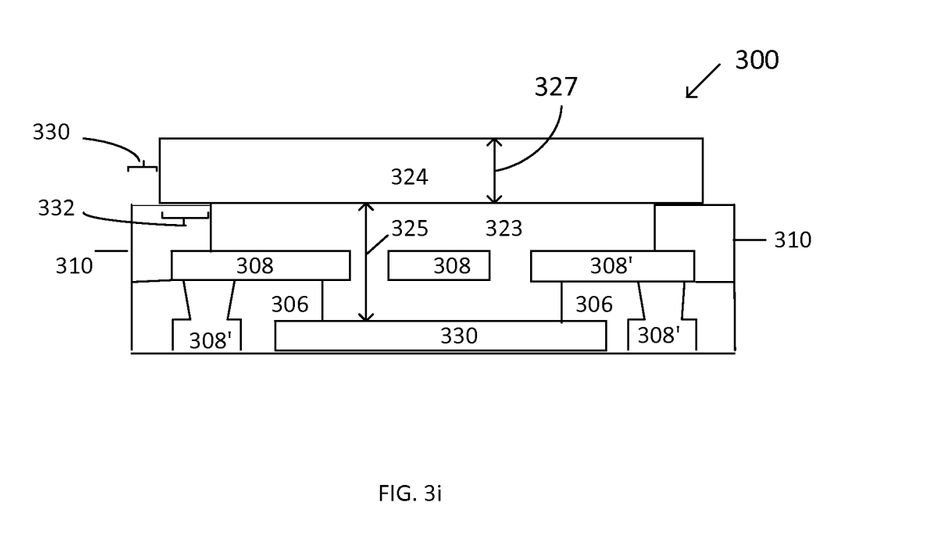

The remaining masking material 312 may then be removed utilizing a suitable removal process such as etching in an embodiment (FIG. 3h), and a single magnet 324 may be placed directly on the resist material 310 disposed on top of conductive traces 308, 308' (shown after the built-up substrate is de-paneled from the core) (FIG. 3i). In an embodiment, the single magnet 324 may enclose the cavity 323, and the package structure 300 may comprise a portion of a sensor integrated package 300. In an embodiment, the single magnet 324 may be placed on the resist material 310 by utilizing a pick and place operation. In an embodiment, the single magnet 324 may provide a hermetic seal of the cavity 323. In an embodiment, the magnet 324 may comprise a low Z height 327, for example less than 1 mm.

In an embodiment, the single magnet 324 may be disposed directly on a first portion 332 of a top surface of the resist material 310 and may not be disposed on a second portion 330 of the top surface of the resist material 310. In another embodiment, the single magnet 324 may be disposed directly on both the first and second portions 330, 332 of the top surface of the resist material 310. In an embodiment, the resist material does not extend across/over the cavity 323. In an embodiment, a middle portion of the magnet is not directly disposed on the resist material 310. In an embodiment, a bottom portion of the cavity comprises the etch stop 330. In an embodiment, the cavity 323 may comprise a height 325 of about 50-100 microns. In an embodiment, the magnet 324 is capable of providing the magnetic field necessary to generate an electromagnetically induced deflection of a beam structure of a sensor device. In an embodiment, the magnet 324 comprises a field strength capable of operating a sensor device coupled with the sensor integrated package 300 at a power input below about 100 microwatts.

Figure 4A:
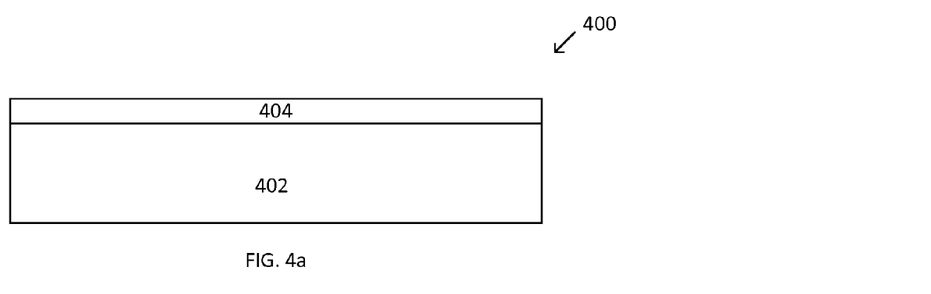
FIGS. 4a-4g represent structures according to embodiments.
Figure 4B:
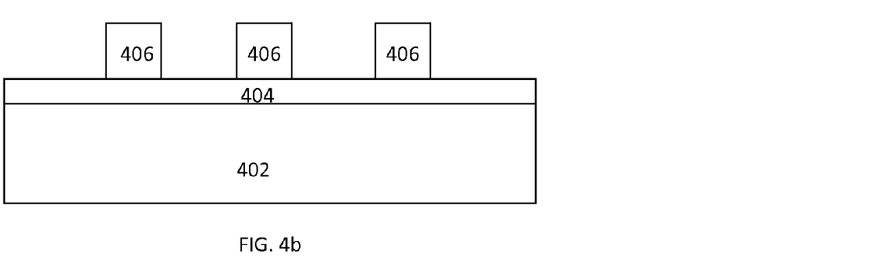
Figure 4C:
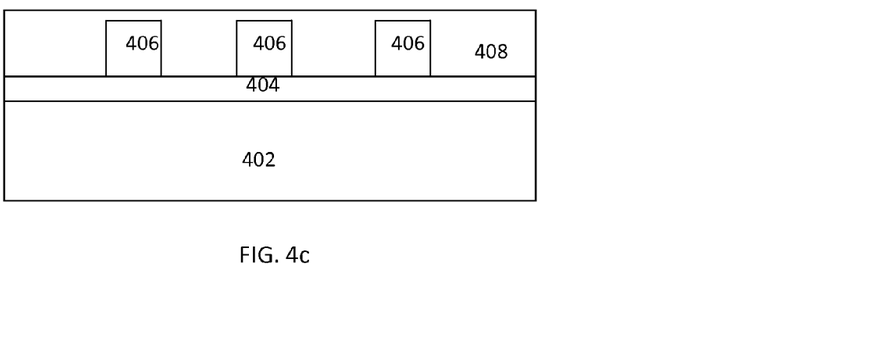

In another embodiment, a plurality of magnets may be formed/placed on/over a cavity of a sensor integrated package structure (FIGS. 4a-4f). In an embodiment, a reconfigured molded cluster of small magnets may be formed using a panel level molding process. In FIG. 4a, a temporary tape 404 may be placed on a carrier substrate 402. The substrate 402 may comprise a very flat base, such as a wafer or toughened glass. At least one magnet 406 may be placed on the temporary tape 404 (FIG. 4b). In an embodiment, a plurality of magnets 406 may be placed on the temporary tape 404. In an embodiment, a connecting material 408, which may comprise an epoxy based material 408, may be placed, by lamination or compression molding, on the magnets 406 (FIG. 4c).

Figure 4D:
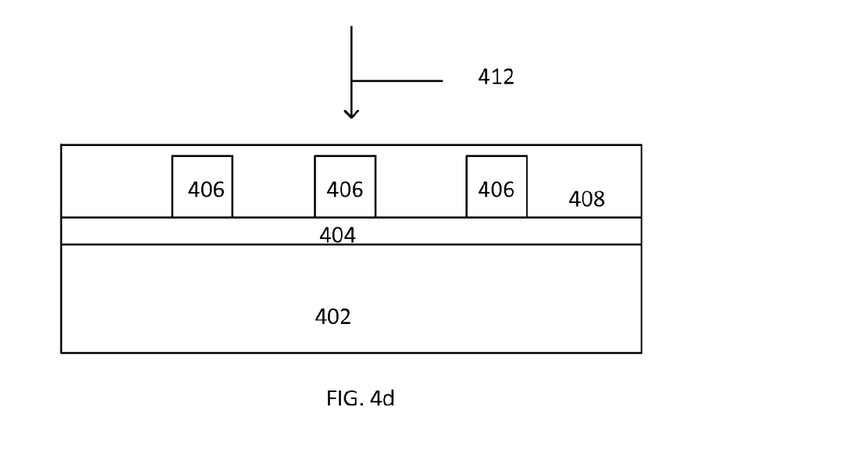
Figure 4E:
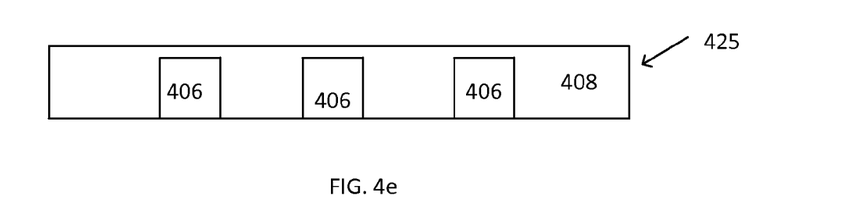
Figure 4F:
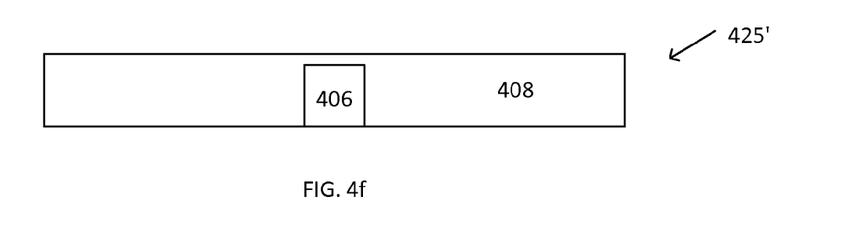
Figure 4G:
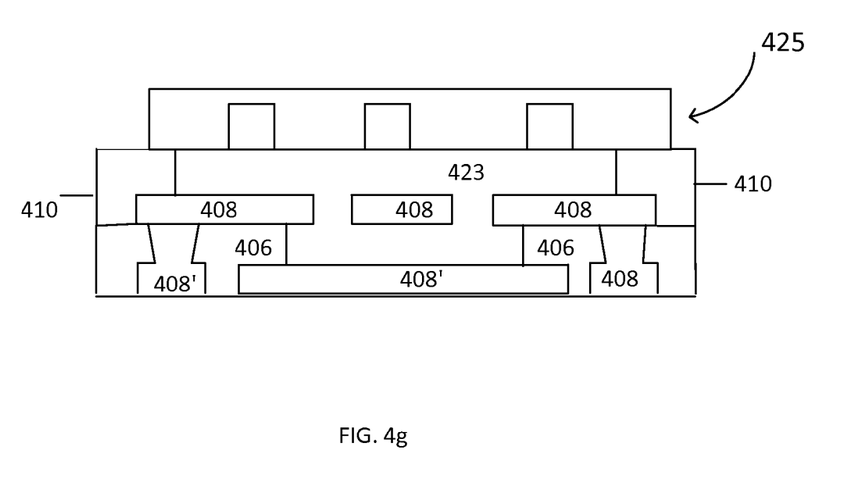

The substrate 402 may be thermally cured 412 using a suitable curing process (FIG. 4d). The combination of magnet/magnets 406 and connecting material 408 may then be de-bonded from the carrier substrate 402, de-taped, and singulated to form a reconfigured cluster 425 containing a plurality of magnets or a reconfigured cluster 425' containing a single magnet disposed within the connecting material 408. (FIGS. 4e-4f). The reconfigured cluster 425, 425' may be placed on/over a cavity 423 of a sensor integrated package 400 (similar to the sensor integrated package of FIG. 3i) (FIG. 4g). In an embodiment, the reconfigured magnets 425, 425' may be placed directly on the first resist material 416.

Figure 5:
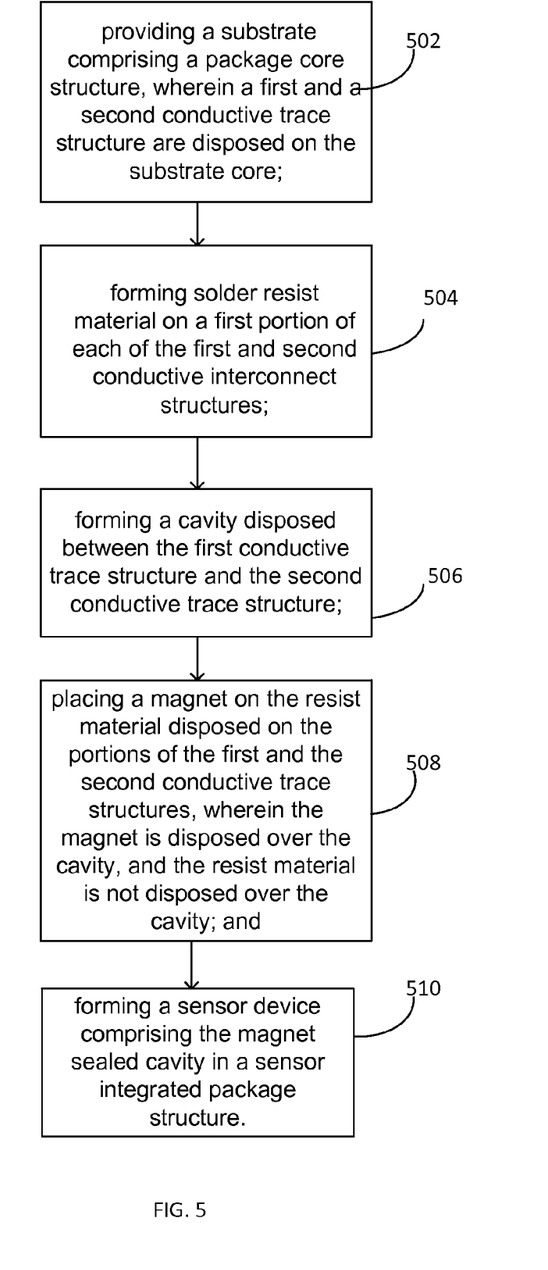
FIG. 5 represents a flow chart of a method according to embodiments.

FIG. 5 depicts a flow chart of a method of forming a sensor integrated package. At step 502, a substrate is provided comprising a package core structure wherein a first and a second conductive trace structure are disposed on the substrate core. At step 504, a solder resist material is formed on a first portion of each of the first and second conductive trace structures. At step 506, a cavity is formed between the first conductive trace structure and the second conductive trace structure. In an embodiment, the cavity is formed in a dielectric layer disposed between the first and second conductive trace structures. The cavity is created subsequent to solder resist material formation.

At step 508, a magnet is placed on the resist material disposed on a portion on of the first conductive trace structure and on a portion of the second conductive trace structure, wherein the magnet is disposed over the cavity and the resist material is not disposed over the cavity. In an embodiment, the magnet forms a hermetic seal over the cavity. At step 510, a sensor integrated package device may be formed, wherein the magnet sealed cavity is disposed within a sensor integrated package structure. In an embodiment, the magnet sealed cavity comprises a portion of the integrated sensor, such as a portion of an accelerometer or a gyroscope.

In an embodiment, the sensor integrated package device structures of the embodiments herein may be coupled with any suitable type of package structures capable of providing electrical communications between a microelectronic device, such as a die and a next-level component to which the package structures may be coupled (e.g., a circuit board). In another embodiment, the devices herein may be coupled with a package structure that may comprise any suitable type of package structures capable of providing electrical communication between a die and another integrated circuit (IC) package coupled with the devices herein.

The devices of the embodiments may comprise circuitry elements such as logic circuitry for use in a processor die, for example. Metallization layers and insulating material may be included in the devices herein, as well as conductive contacts/bumps that may couple metal layers/interconnects to external devices/layers. The devices described in the various figures herein may comprise portions of a silicon logic die or a memory die, for example, or any type of suitable microelectronic device/die. In some embodiments the devices may further comprise a plurality of dies, which may be stacked upon one another, depending upon the particular embodiment. In some cases the die(s) of the devices herein may be located/attached/embedded on either the front side, back side or on/in some combination of the front and back sides of a package structure. In an embodiment, the die(s) may be partially or fully embedded in a package structure of the embodiments.

The various embodiments of the device structures included herein may be used for system on a chip (SOC) products that may require an integrated sensor, such as smart phones, notebooks, tablets, wearable devices and other electronic mobile devices. In various implementations, the sensor integrated device may be included in a laptop, a netbook, a notebook, an ultrabook, a smartphone, a tablet, a personal digital assistant (PDA), an ultra mobilePC, a mobile phone, a desktop computer, a server, a printer, a scanner, a monitor, a set-top box, an entertainment control unit, a digital camera, a portable music player, or a digital video recorder, and wearable devices. In further implementations, the sensor integrated package devices herein may be included in any other electronic devices that process data.

The embodiments herein include realization of sensors integrated with package structures. Embodiments include low Z height and low cost integrated sensor packages. The embodiments herein provide a cavity and a low Z-height magnet, wherein for example, a 200 micron thick/height magnet may cover the entire cavity, and may provide sufficient magnetic strength for optimal sensor operation, such as above 0.1 T. Forming the cavity after solder resist deposition and patterning eliminates the possibility of having the cavity collapse, which may occur, for example, if the solder resist is laminated after the cavity has been created, as in some prior art sensor integrated devices.

Figure 6:
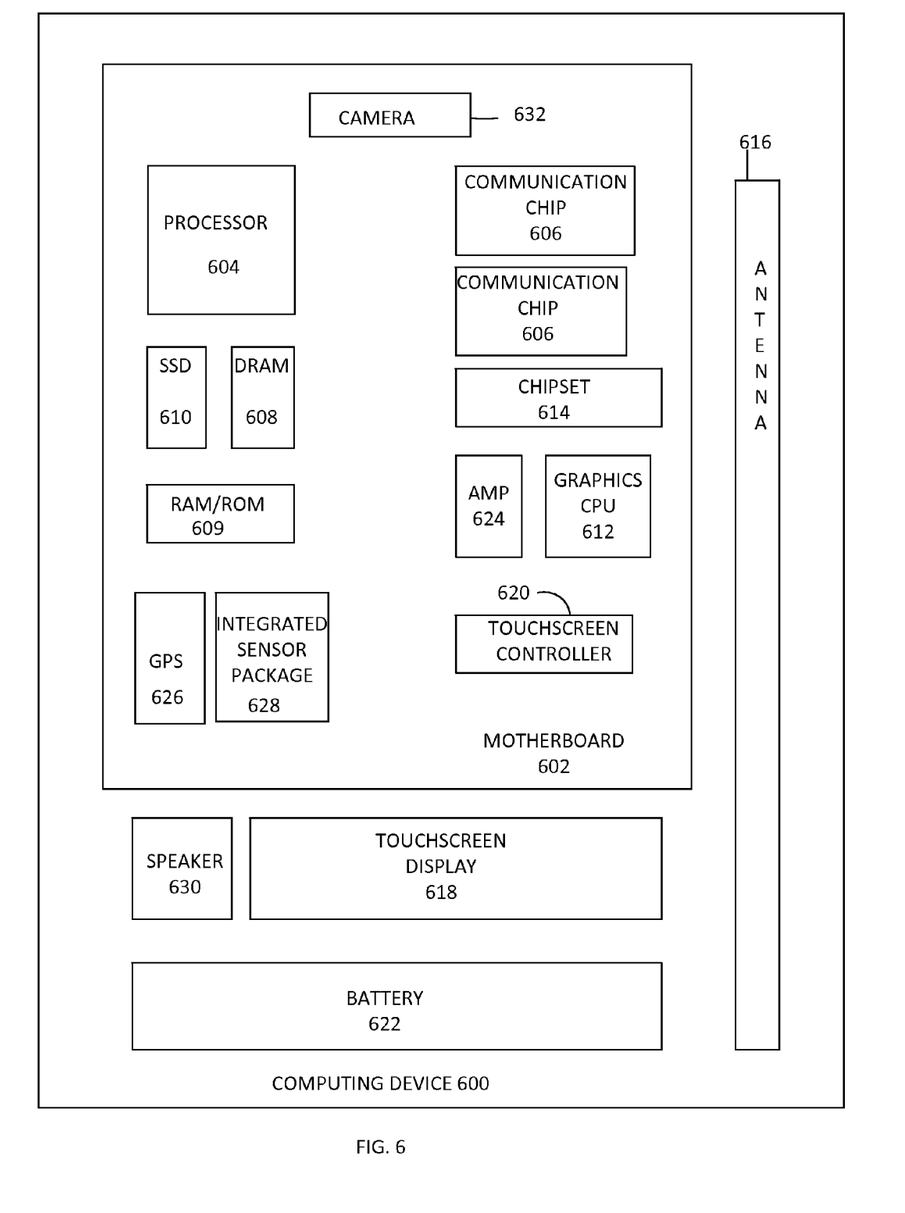
FIG. 6 represents a system according to embodiments.

FIG. 6 is a schematic of a computing device 600 according to an embodiment. The computing device 600 houses a board 602, such as a motherboard for example. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602, and may or may not be communicatively coupled to each other. These other components include, but are not limited to, volatile memory (e.g., DRAM) 608, non-volatile memory (e.g., ROM) 609, flash memory (not shown), a graphics processor 612, a digital signal processor (not shown), a crypto processor (not shown), a chipset 614, an antenna 616, a display 618 such as a touchscreen display, a touchscreen controller 620, a battery 622, an audio codec (not shown), a video codec (not shown), a power amplifier 624, a global positioning system (GPS) device 626, a compass, accelerometer, a gyroscope and other inertial sensors 628, such as the sensor integrated package device of the embodiments herein, a speaker 630, a camera 632, and a mass storage device (such as hard disk drive, or solid state drive) 610, compact disk (CD) (not shown), digital versatile disk (DVD) (not shown), and so forth). These components may be connected to the system board 602, mounted to the system board, or combined with any of the other components.

The communication chip 606 enables wireless and/or wired communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

In some implementations, any one or more of the components of FIG. 6, such as the integrated circuit die of the processor, memory devices, communication devices, or other components may include the sensor device structures and packages of the embodiments as described herein. The term "processor" may refer to any device or portion of a device that processes electronic data from registers and/or memory to transform that electronic data into other electronic data that may be stored in registers and/or memory.

In various implementations, the computing device 600 may be a laptop, a netbook, a notebook, an ultrabook, a smartphone, a tablet, a personal digital assistant (PDA), an ultra mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:
1. A microelectronic sensor integrated package structure comprising:
   a package substrate comprising a dielectric material;
   a first conductive trace and a second conductive trace disposed directly on the dielectric material, wherein the first conductive trace is located in a first metal layer of the dielectric material and the second conductive trace is located in a second metal layer of the dielectric material;

a resist material disposed directly on a portion of the first conductive trace;

a magnet disposed directly on at least a portion of the resist material; and a cavity disposed between the magnet and the first trace, wherein the resist material does not extend across the cavity, and wherein the magnet is directly adjacent the cavity.

2. The structure of claim 1 wherein the magnet provides a hermetic seal of the cavity.

3. The structure of claim 1 wherein the first and second conductive traces are coupled to anchor structures of at least one of a gyroscope or an accelerometer.

4. The structure of claim 1 further comprising wherein the first metal layer comprises at least one sensor component.

5. The structure of claim 4 wherein the at least one sensor component is selected from the group consisting of a proof mass, a coil and a beam.

6. The structure of claim 1 further comprising wherein the cavity comprises a sensor cavity, and wherein the magnet comprises a field strength capable of operating a sensor device coupled with the sensor integrated package at a power input below about 100 microwatts.

7. The structure of claim 1 further comprising wherein the magnet comprises a thickness of below about 1 mm.

8. A microelectronic device structure comprising:
a board;
a package structure coupled to the board, wherein the package structure comprises:
a dielectric material;
a first and a second conductive trace disposed on the dielectric material, wherein the first conductive trace is located in a first metal layer of the dielectric material and the second conductive trace is located in a second metal layer of the dielectric material;
a resist material disposed directly on a portion of the first conductive trace;
a magnet disposed directly on at least a portion of the resist material; and
a cavity disposed between the magnet and the first trace, wherein the resist material does not extend across the cavity, and wherein the magnet is directly adjacent the cavity.

9. The structure of claim 8 further comprising wherein the device structure comprises a portion of a sensor integrated package.

10. The structure of claim 9 further comprising wherein the sensor integrated package comprises at least one of a gyroscope or an accelerometer.

11. The structure of claim 8 wherein at least one of the first and second conductive trace structures are coupled to an anchor structure of a sensor device.

12. The structure of claim 8 wherein the magnet comprises a Z height of less than about 1 mm.

13. The structure of claim 8 further comprising a system comprising:
a communication chip communicatively coupled to the microelectronic structure; and
a DRAM communicatively coupled to the communication chip.

14. The structure of claim 8 further comprising wherein the first and second conductive trace structures are coupled with a beam structure of a sensor device.

15. The structure of claim 14 further comprising wherein the magnet is capable of providing a magnetic field to generate an electromagnetically induced deflection of the beam.

16. A method of forming a microelectronic package structure, comprising:
providing a substrate core comprising a dielectric material, wherein a first and a second conductive trace structure are disposed on the dielectric material;
forming a resist material directly on at least a portion of the first conductive trace structures;
forming a cavity directly adjacent the first conductive trace structure; and
placing at least one magnet directly on at least a portion of the resist material, wherein the at least one magnet is disposed directly adjacent the cavity and the resist material is not disposed across the cavity.

17. The method of claim 16 further comprising wherein the microelectronic package structure comprises a portion of a sensor integrated package.

18. The method of claim 17 further comprising wherein at least one of the first or the second conductive trace structures are coupled with a beam structure of a sensor device that is coupled with the sensor integrated package.

19. The method of claim 18 further comprising wherein the at least one magnet is capable of providing a magnetic field to generate an electromagnetically induced deflection of the beam.

20. The method of claim 16 further comprising wherein the cavity is formed after the resist is formed on the portion of the first conductive trace structure.

21. The method of claim 16 wherein placing the at least one magnet further comprises:
forming a plurality of magnets in a dielectric layer to form a reconfigured magnet structure; and
placing the reconfigured magnet structure directly on the resist material.

22. The method of claim 16 further comprising wherein the at least one magnet comprises a Z height of less than about 1 mm.

* * * * *